United States Patent [19]
Leffel et al.

[11] Patent Number: 5,831,479
[45] Date of Patent: Nov. 3, 1998

[54] POWER DELIVERY SYSTEM AND METHOD OF CONTROLLING THE POWER DELIVERY SYSTEM FOR USE IN A RADIO FREQUENCY SYSTEM

[75] Inventors: Michael David Leffel, Crystal Lake; Edward Vincent Louis, St. Charles; Douglas Edward Miller, Lake Zurich; Mark G. Obermann, Niles; Timothy Mark Avicola, Algonquin, all of Ill.

[73] Assignee: Motorola, Inc., Schaumburg, Ill.

[21] Appl. No.: 662,573

[22] Filed: Jun. 13, 1996

[51] Int. Cl.$^6$ ................................. H03F 3/68; H03F 1/14
[52] U.S. Cl. ......................... 330/124 D; 330/51; 330/284
[58] Field of Search ............................ 330/2, 51, 124 D, 330/124 R, 129, 284

[56] References Cited

U.S. PATENT DOCUMENTS

| | | | |
|---|---|---|---|
| 3,072,858 | 1/1963 | Siskind | 330/124 D |
| 4,298,844 | 11/1981 | Shimp | 330/124 D |
| 4,780,685 | 10/1988 | Ferguson | 330/124 D |
| 5,025,225 | 6/1991 | Tajima et al. | 330/124 D |
| 5,256,987 | 10/1993 | Kibayashi et al. | 330/51 X |

FOREIGN PATENT DOCUMENTS

| | | | |
|---|---|---|---|
| 0540286A1 | 10/1992 | European Pat. Off. . | |
| 56-112106 | 9/1981 | Japan | 330/124 D |

OTHER PUBLICATIONS

Ulrich H. Gysel, "A new N–Way Power Divider/Combiner Suitable for High Power Applications", 1975, pp. 116–118.

D.I. Stones, "A UHF 16–Way Power Combiner Designed by Synthesis Techniques", Microwave Journal, Jun. 1989, pp. 117–120.

Earnest Franke, "Excess Insertion Loss at the Input Ports of a Combiner Hybrid", RF Design, Nov. 1985, pp. 43–48.

Ernest J. Wilkinson, "An N–Way Hybrid Power Divider", Jan. pp. 116–118.

Adel Saleh, "Planar Electrically Symmetric N–Way Hybrid Power Dividers/Combiners", 1980 IEEE pp. 555–563.

Gage and Hazen, "Design and Performance of a 16–way Combiner Using 1/16 Wavelength Microstrip Transmission Lines", pp. 451–461.

Galani and Temple, "A Broadband Planar N–Way Combiner/Divider", pp. 499–502.

Groff and MacGahan, "Combine High Power Levels at VHF and UHF", Design Feature, Dec. 1990, pp. 100–108.

Cohn, Geller and Schellenberg, "A 10–Watt Broadband FET Combiner Amplifier", pp. 292–296.

*Primary Examiner*—Steven Mottola
*Attorney, Agent, or Firm*—Donna Rogers Maddox

[57] ABSTRACT

A power delivery system (500) including a power splitter (502), a plurality of power amplifier modules (508) responsive to the power splitter (502), a power combiner (504), and a gateway controller (506) is provided. Each of the plurality of power amplifier modules (508) include an input switch (520), a variable attenuator (524), an RF power amplifier (526) responsive to the variable attenuator (524) and the input switch (520), an output switch (530) responsive to the RF power amplifier (526), and an alarm detector (532) for indicating an alarm condition of the RF power amplifier (526). The power combiner (504) is responsive to the plurality of power amplifier modules (508), and the gateway controller (506) is in communication with each of the plurality of power amplifier modules (508).

18 Claims, 12 Drawing Sheets

POWER DELIVERY SYSTEM AND METHOD OF CONTROLLING THE POWER DELIVERY SYSTEM FOR USE IN A RADIO FREQUENCY SYSTEM

FIELD OF THE INVENTION

The present invention relates generally to radio frequency systems and, more particularly, to a power delivery system for use in a radio frequency system.

BACKGROUND OF THE INVENTION

Extended linear power amplifier systems have been proposed for use in cellular base stations. These systems include a number of linear power amplifier modules producing a corresponding number of output signals that need to be combined into a single high power signal before transmission. Such systems are typically used in communication systems such as in a base site of a radiotelephone system. In such systems, it is desirable that the number of linear power amplifier modules may be any number from a minimum number up to a maximum number of allowable amplifiers. In this manner, the amount of power output by the transmission unit of the base station may be adjusted. In addition, it is desirable that the system provides adequate power amplification efficiency across the entire range of selected amplifiers, i.e. from the minimum number to the maximum number of amplifiers.

Another reason for providing multiple amplifiers is to provide continued operation if one of the amplifiers fails. A conventional method of continuing operation is a method known as load shedding. In the load shedding method, after a fault is detected, all new calls that would be handled by the affected sector associated with the faulty amplifier are blocked and a predetermined percentage of the existing channels are taken out of service. After the fault has cleared, traffic is then returned to normal capacity. Although the load shedding procedure allows for continued operation after a failure condition, it would be desirable if the system could maintain the traffic level prior to the failure and reduce the impact resulting from the failure to call processing.

Accordingly, there is a need for an improved power delivery system and a method of controlling the power delivery system for use in a RF system, such as a cellular system.

SUMMARY OF THE INVENTION

The present invention addresses this need by providing a power delivery system for use in a radio frequency system. The power delivery system includes a power splitter, a plurality of power amplifier modules responsive to the power splitter, a power combiner, and a gateway controller. Each of the plurality of power amplifier modules include an input switch, a variable attenuator, an RF power amplifier responsive to the variable attenuator and the input switch, an output switch responsive to the RF power amplifier, and an alarm detector for indicating an alarm condition of the RF power amplifier. The power combiner is responsive to the plurality of power amplifier modules, and the gateway controller is in communication with each of the plurality of power amplifier modules. In accordance with another aspect of the present invention, each of the plurality of power amplifier modules includes an input switch, a variable attenuator, an RF power amplifier, an output switch, and a power detector for determining a power level associated with the RF power amplifier.

In accordance with another aspect of the present invention, an alternative power delivery system for use in a radio frequency communication system is provided. The system includes a power splitter, a variable attenuator, a first input switch, a first power amplifier, a first output switch, a second input switch, a second power amplifier, a second output switch, and a power combiner. The variable attenuator is in communication with the power splitter and the first input switch is responsive to the power splitter. The first power amplifier is responsive to the first input switch, and the first output switch is responsive to the first power amplifier. Similarly, the second input switch is responsive to the power splitter, the second power amplifier is responsive to the second input switch, and the second output switch is responsive to the second power amplifier. The power combiner is responsive to the first and second output switches.

According to another aspect of the invention, a method of controlling a plurality of power amplifier modules in a power delivery system is provided. The method includes the steps of detecting an alarm condition in a first of the plurality of power amplifier modules, determining a gain reduction level, reducing the power gain in each of the other power amplifier modules by the determined gain reduction level, and taking the first power amplifier module out of service.

According to a further aspect of the invention, a method of controlling a power delivery system with a power splitter, a plurality of power amplifier modules, and a power combiner is provided. The method includes the steps of determining whether a sleep criteria has been met, and placing one of the plurality of power amplifier modules in a sleep mode during a sleep time interval. The method also includes the step of placing the power amplifier module in the sleep mode into an active mode.

The invention itself, together with its attendant advantages, will best be understood by reference to the following detailed description, taken in conjunction with the accompanying drawings.

DETAILED DESCRIPTION OF THE PREFERRED EMBODIMENTS

Figure 1:
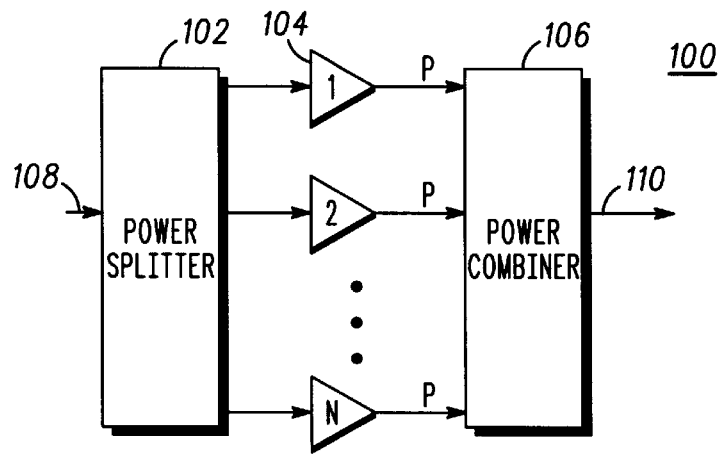
FIG. 1 is a block diagram of a radio frequency circuit of a power delivery system with a splitter, a power combiner, and a plurality of power amplifier modules.

Referring now to FIG. 1, a radio frequency (the "RF") circuit including a power splitter and power combiner 100 is illustrated. The power splitter and power combiner circuit 100 includes a power splitter circuit 102, a set of amplifiers 104, and a power combiner 106. The power splitter 102 receives an input signal 108 that is to be split into a plurality of output signals. The plurality of output signals from the power splitter 102 are fed into individual power amplifiers within the set of power amplifiers 104. The output of the power amplifiers 104 are each fed into the power combiner 106. The combiner 106 receives each of the outputs from the set of amplifiers 104 and produces an output signal 110. In the preferred embodiment, the power splitter 102 is coupled to the set of amplifiers 104, which in turn are coupled to the power combiner 106. A circuit for performing either of the functions of the power splitter 102 or the power combiner 106 according to a preferred embodiment will now be illustrated with respect to FIG. 2. For convenience, such a circuit will be referred to as a power combiner even though the circuit may also be configured as a power splitter.

Figure 2:
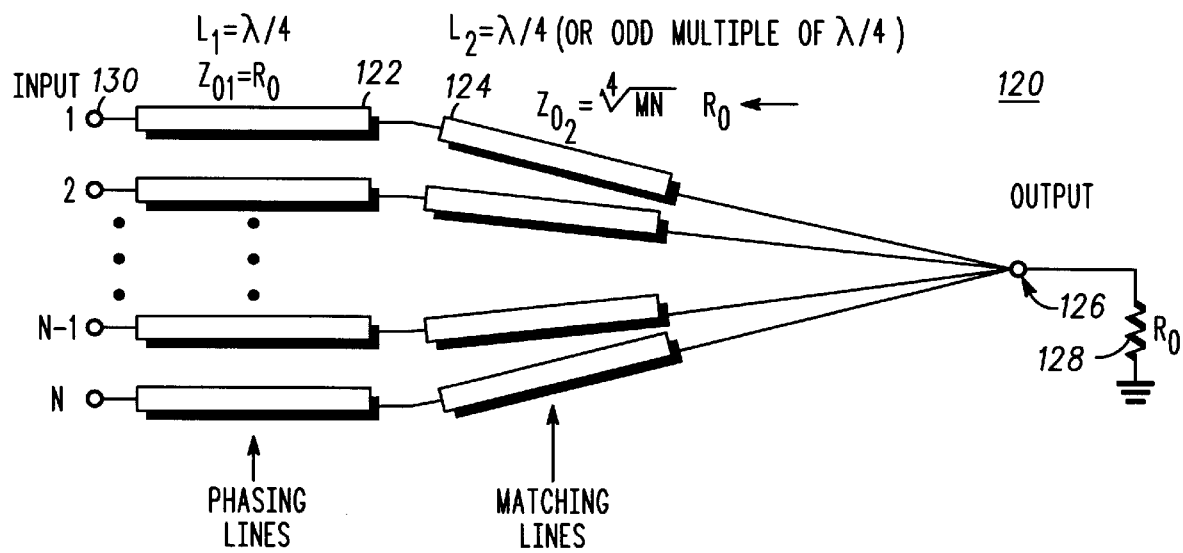
FIG. 2 is a schematic diagram of a preferred embodiment of the power combiner of FIG. 1.

Referring to FIG. 2, a power combiner 120 according to a preferred embodiment is illustrated. The power combiner 120 includes a plurality of phasing transmission lines 122, a plurality of matching transmission lines 124, a common node 126, an output load 128, and a set of input nodes 130. The set of input nodes 130 are each coupled to an amplifier within the set of amplifiers 104. Each of the phasing transmission lines 122 is connected to one of the input nodes 130 at one end and is connected to one of the matching transmission lines 124 at the other end. Each of the phasing transmission lines 122 has a characteristic impedance which is substantially equivalent to the output load 128. In this example, since the output load has an impedance of 50 Ohms, each of the phasing transmission lines has a characteristic impedance of about 50 Ohms. Also, each of the phasing transmission lines 122 has a length which is equal to a quarter wavelength or an odd multiple thereof.

Each of the matching transmission lines 124 is connected to the common node 126. In addition, each of the matching transmission lines 124 has a length which is equal to a quarter wavelength or an odd multiple thereof. Further, each matching transmission line 124 has a characteristic impedance determined according to a function of the minimum and maximum number of amplifiers in the set of amplifiers 104. In the preferred embodiment the function is a nonlinear function. Most preferably, the function is the fourth root of the product of the minimum number of amplifiers and the maximum number of amplifiers, which is then multiplied by the load impedance 128. However, other nonlinear functions, such as a cube root function although not as optimal as the fourth root function will also provide suitable performance. This formula is illustrated in FIG. 2 adjacent to the matching transmission lines 124. The common node 126 is connected to each of the matching transmission lines 124 and is also connected to a load, typically a 50 Ohm resistance 128. Although the above description with reference to FIG. 2 illustrates a power combiner 106, the circuit 120 is also suitable for use as the power splitter 102.

Figure 3:
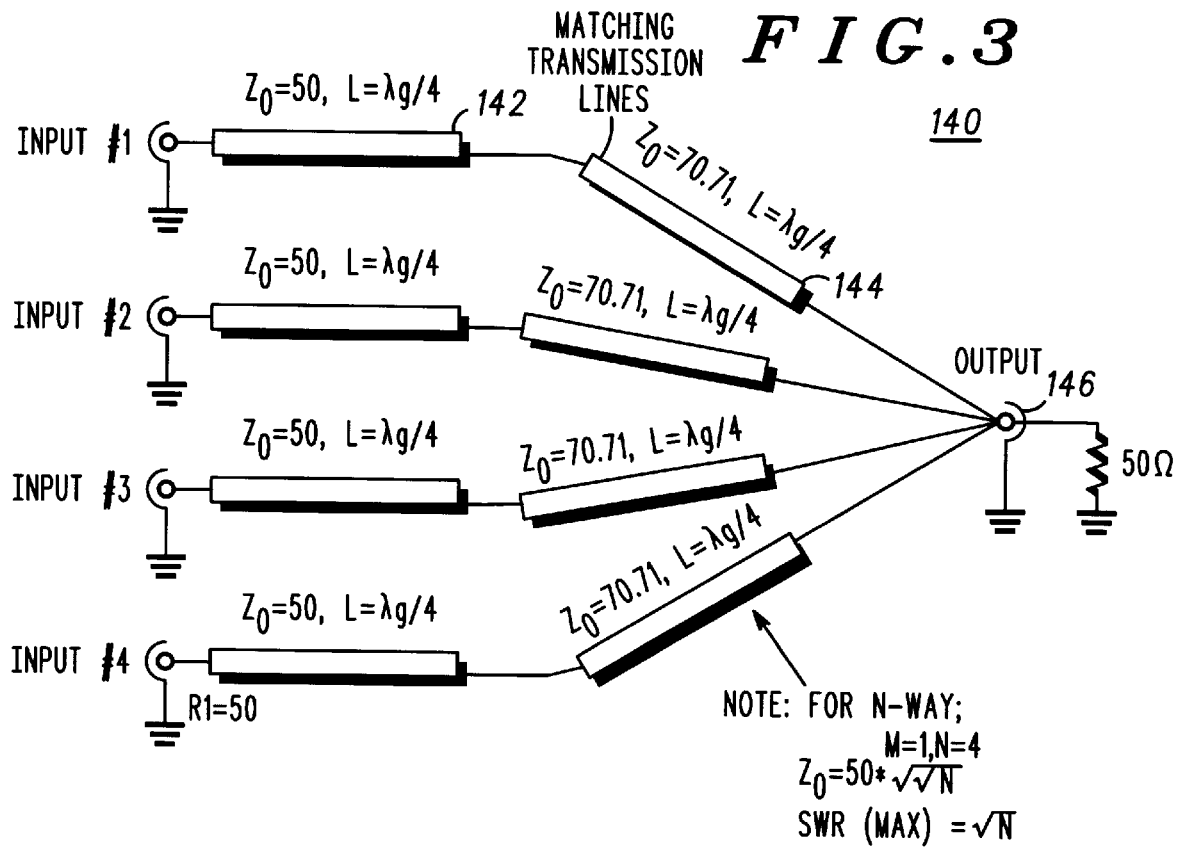
FIG. 3 is a schematic diagram of a preferred embodiment of a four input power combiner.

Referring to FIG. 3, an example of a power combiner 140 having a minimum of one amplifier and a maximum of four amplifiers is illustrated. The combiner 140 includes four phasing transmission lines 142, four matching transmission lines 144, and a common node 146. Each of the phasing transmission lines 142 has an impedance of 50 Ohms and a length equal to a quarter wavelength. Each of the matching transmission lines has a length of a quarter wavelength and has a characteristic impedance of about 70.71 Ohms. The impedance of the matching transmission lines 144 is determined according to the preferred fourth root formula described above. Those skilled in the art will appreciate that the power combiner circuit 140 has many advantages. For example, the power combiner circuit 140 provides for improved power and efficiency across a range of amplifiers that may be connected to the combiner 140. Further, the preferred circuit 140 provides improved efficiency without degrading the useful bandwidth of the combiner.

Figure 4:
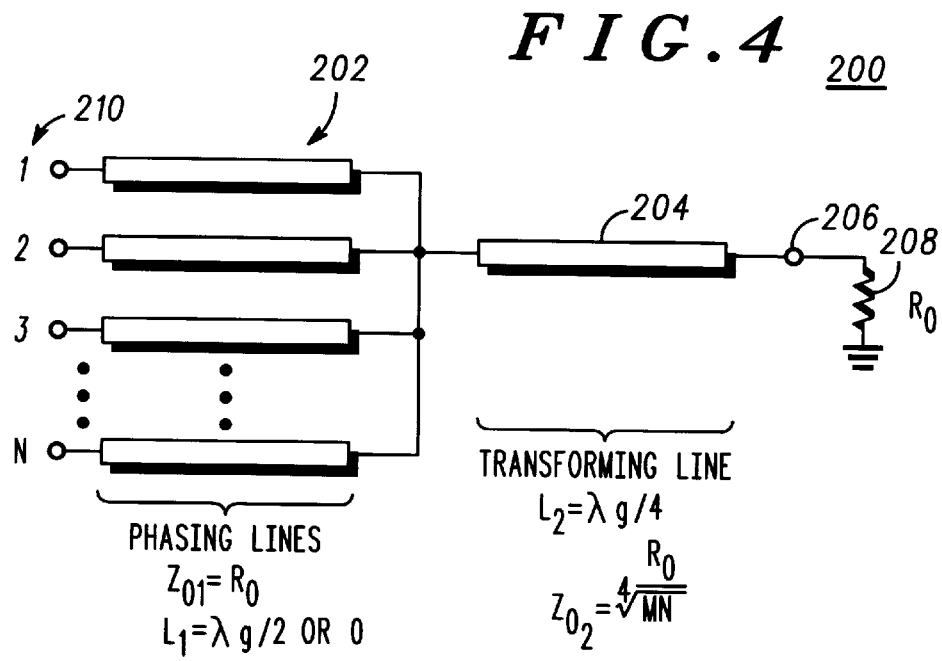
FIG. 4 is a schematic diagram of another preferred embodiment of the power combiner of FIG. 1.

Referring now to FIG. 4, a second preferred embodiment of a power combiner 200 is illustrated. The combiner 200 includes phasing lines 202 and a transforming line 204 which is connected to an output node 206. The output node 206 is connected to a load resistor 208. The phasing lines 202 are each connected to one of a set of input nodes 210 which support and are coupled to a set of amplifiers 104. The phasing transmission lines 202 each have a length of one-half wavelength and each have a characteristic impedance of about 50 Ohms. The transforming line 204 is coupled to each of the phasing lines 202 at one end and is coupled to the output node 206 at the other end. The transforming line 204 has a length of one-quarter wavelength. In the preferred embodiment, the transforming line 204 has a characteristic impedance determined in accordance with the formula shown in FIG. 4. The characteristic impedance of the transforming line is calculated by dividing the load resistor impedance by the fourth root of the product of the minimum number of amplifiers connectable to the set of inputs 210 and the maximum number of amplifiers connectable to the inputs 210.

Those skilled in the art will appreciate that some applications will be more suitable for using the combiner 120, and other applications will be more suitable to the combiner 200. One factor in determining whether to use the combiner 120 or the combiner 200 will be the calculated length and the characteristic impedance of the transforming line 204. In some applications the characteristic impedance of the transforming line 204 may be too small to be implemented with existing transmission line technology. In this case, the combiner 120 illustrated in FIG. 2 should be used instead. Also, those skilled in the art will appreciate that any of the transmission lines described herein may be produced according to well known transmission line technology, such as strip line technology. Preferably, considering practical size constraints, the transmission line technology chosen should be suitable for applications with a frequency greater than 200 megahertz.

Figure 5:
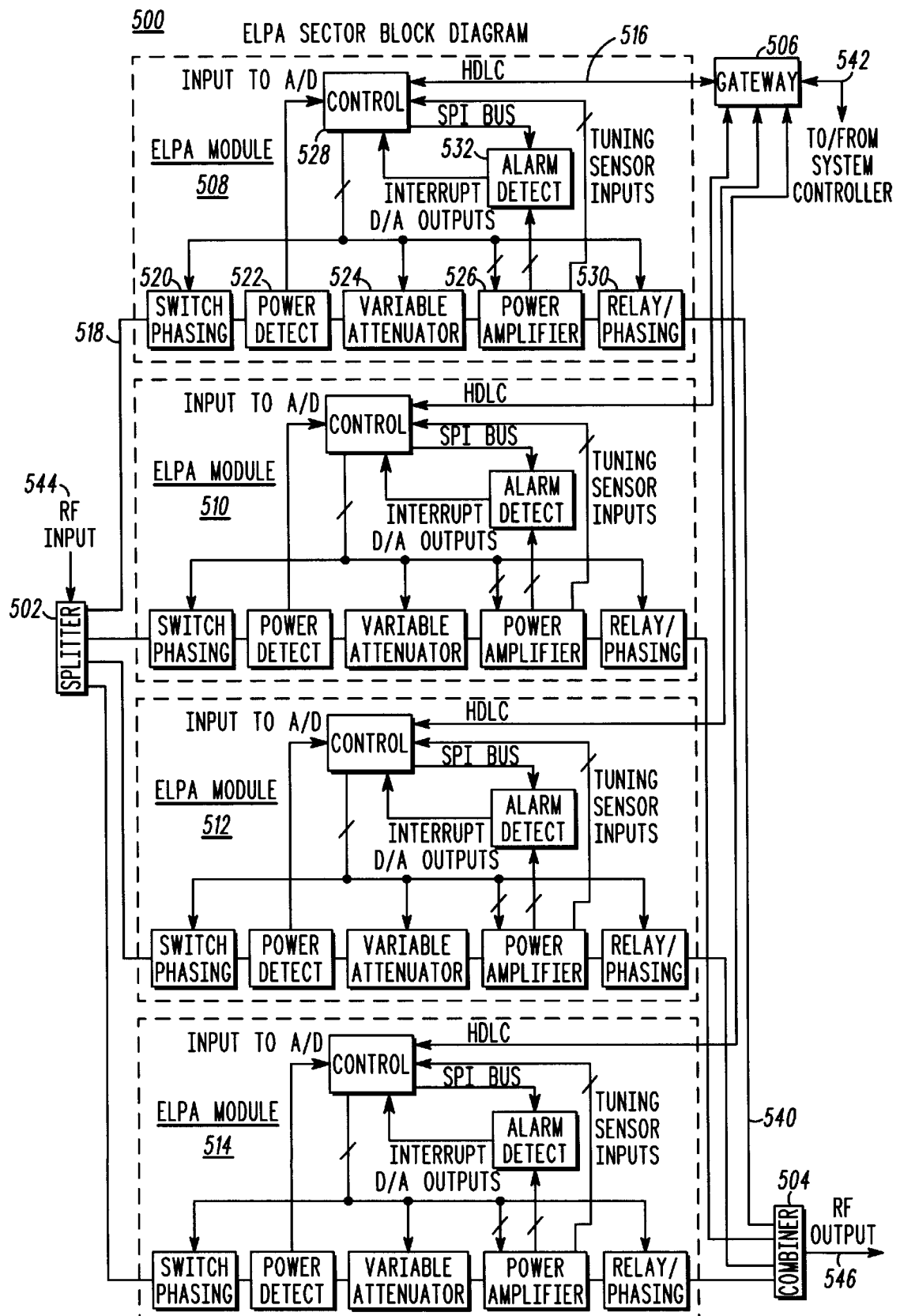
FIG. 5 is a block diagram of an embodiment of a power delivery system.

Referring to FIG. 5, an embodiment of a power delivery system 500 is shown. The power delivery system 500 includes a splitter 502, a plurality of power amplifier modules 508–514, a gateway controller 506, and a power combiner 504. Each of the power amplifier modules 508–514 are coupled to the splitter 502, the combiner 504 and the gateway controller 506. In the preferred embodiment, the splitter 502 is a power splitter, such as the splitter of FIGS. 1–4. Similarly, the combiner 504 is preferably a power combiner, such as the combiner of FIGS. 1–4. The gateway controller 506 is preferably implemented as an embedded microprocessor controller, such as a Motorola 68360 or 68HC11.

Each of the amplifier modules 508–514 is preferably substantially the same so only module 508 will be described in detail. The power amplifier module 508 includes an input switch 520, a power detector 522, a variable attenuator 524, a power amplifier 526, an output switch 530, an alarm detector 532, and a control module 528. The control module 528 is coupled to the gateway controller 506 via a data interface 516. The control module 528 is also coupled to each of the other components in the power amplifier module 508.

Figure 8:
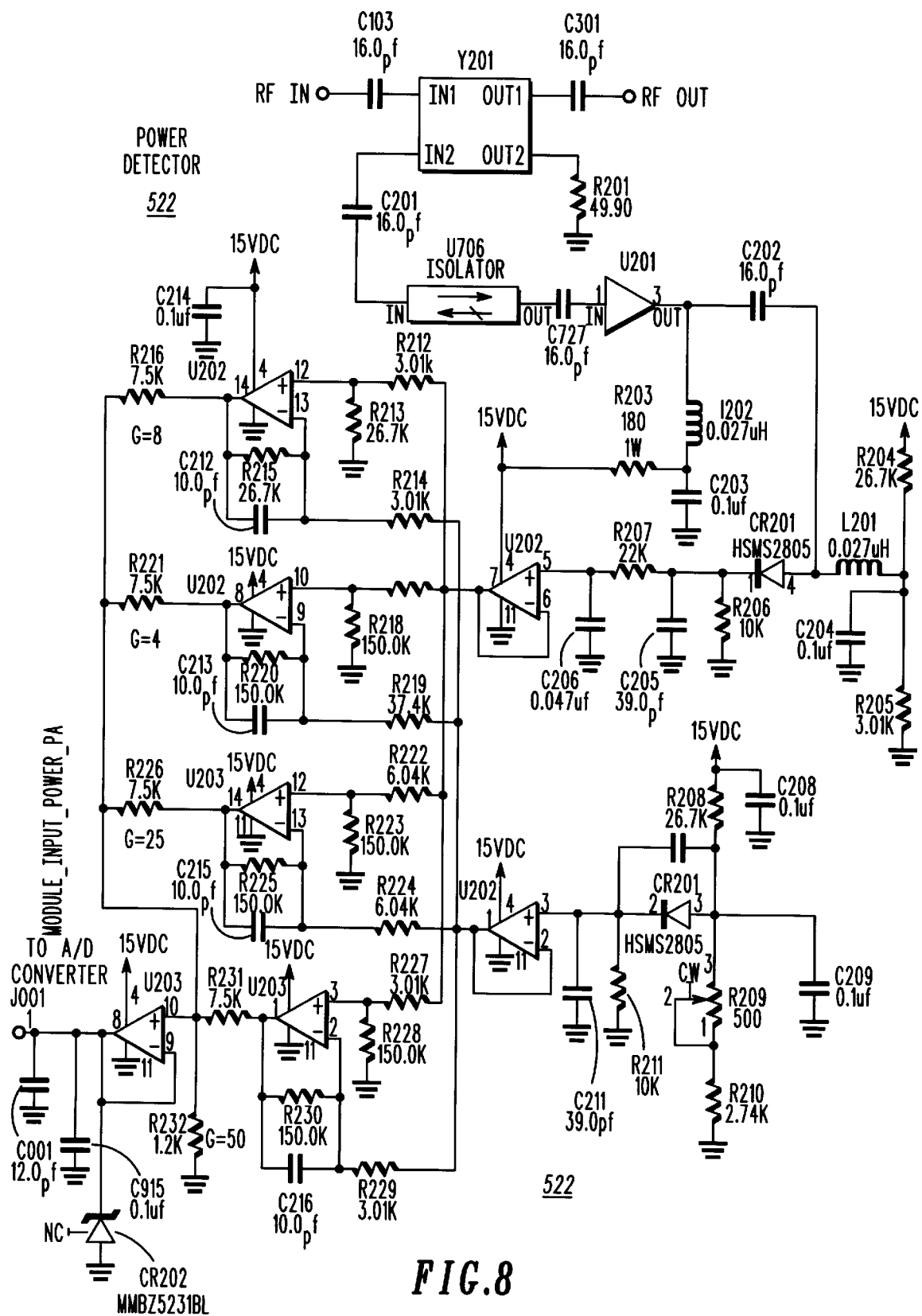
FIG. 8 is a schematic diagram of the power detector of FIG. 5.

In the presently preferred embodiment, the input switch 520 is a SHS-080AG switch from Hitachi Metals America, Ltd, Arlington Heights, Ill., and the output switch 530 is a RSS-SR001 relay from RelComm Technologies, Inc., Salisbury, Md. The amplifier 526 is preferably a feedforward type of amplifier, such as the feedforward amplifier in a Motorola SC™9600 base station or as described in U.S. Pat. No. 5,307,022. The local control module 528 is preferably implemented as an embedded microprocessor controller, such as a Motorola 68360 or 68HC11. The power detector 522 is any suitable circuit that can detect a power level associated with the power amplifier 526, such as a power detection circuit for detecting the input power level of the power amplifier. A detailed schematic of an example of such a power detector 522 is shown for illustration purposes in FIG. 8. Although the power detector 522 is shown within module 508, the power detector 522 may be located at many alternative positions in the system 500, such as at the RF input 544 or at the RF output 546.

Figure 9:
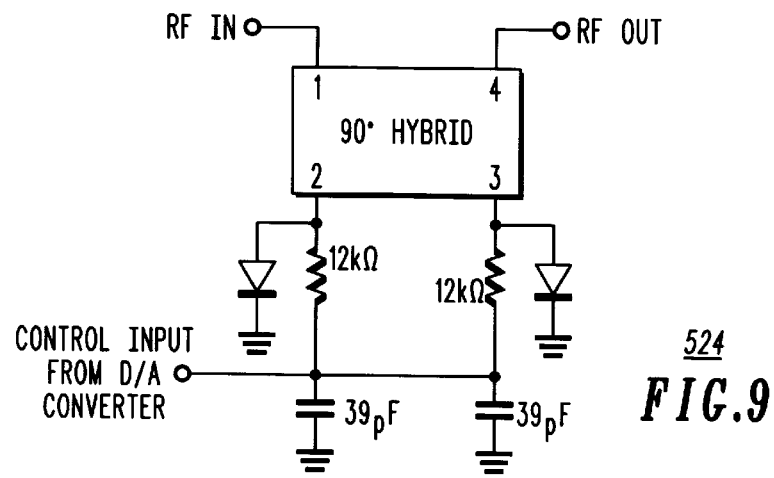
FIG. 9 is a schematic diagram of the variable attenuator of FIG. 5.

The variable attenuator 524 may also be implemented with suitable circuit elements and an example of such a circuit is shown in FIG. 9. It should be understood that the variable attenuator may be placed at any position in the system 500 that is prior to the power amplifier 526, such as at the RF input 544.

Figure 10:
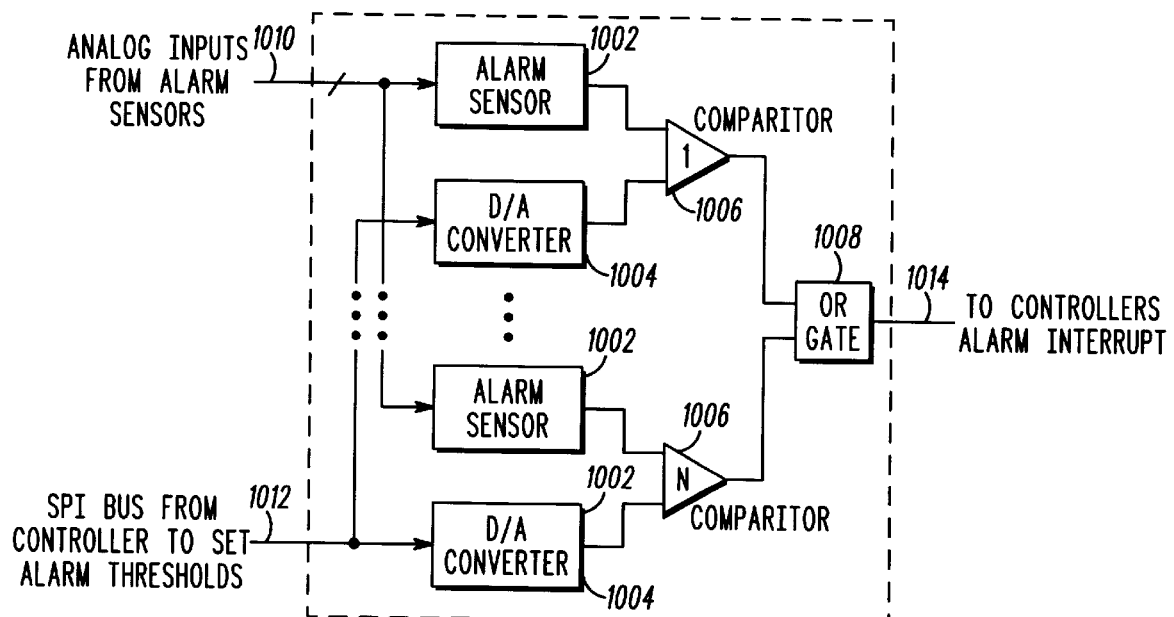
FIG. 10 is a block diagram of the alarm detector of FIG. 5.

Referring to FIG. 10, a preferred embodiment of the alarm detector 532 is shown. The alarm detector includes a plurality of alarm sensors 1002, a plurality of digital to analog converters (D/A) 1004, a plurality of comparitors 1006, and a digital logic component, such as OR gate 1008. The alarm detector 532 receives alarm sensor inputs 1010, and alarm thresholds 1012 and produces an alarm interrupt 1014 indicating that an alarm condition has occurred. The alarm interrupt 1014 is fed to module controller 528, which sends an alarm message to the gateway controller 506 to inform the gateway 506 of the alarm.

The alarm detector 532 is designed to detect faults that may be severe enough to remove a module from service. The sensors 1002 may be of various types depending on the type of fault to be detected and vary depending upon the particular application and implementation. The following list of suitable sensors is not exhaustive and is for illustrative purposes only: temperature alarm—Analog Devices TMP-01E, PT suppression alarm—RSSI voltage from Signetics SA604 receiver IC, overdrive or reflected power alarms—voltages from power detector of FIG. 8, synthesizer lock alarm—Motorola MC145200, and current alarm—current sensing resistor on each power amplifier stage. In addition to physical hardware alarms, there may also be software alarm conditions, such as invalid convergence data (e.g. bad checksum, invalid date, variables outside of approved range), improper software download, time-outs on various expected messages, or tuning alarm (i.e. control out of range or other violation based on expected performance).

Figure 11:
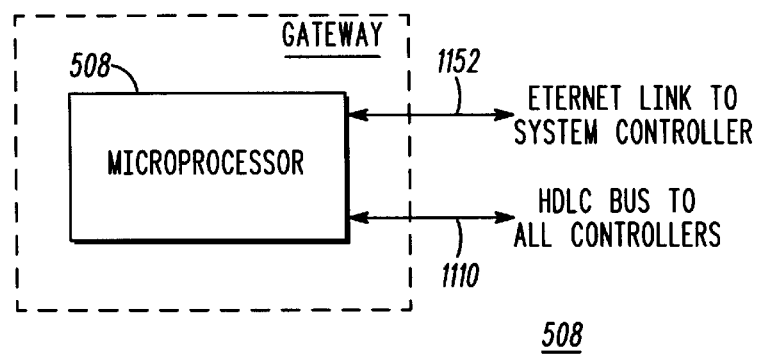
FIG. 11 is a block diagram of the controller and the gateway controller of FIG. 5.
Figure 11:
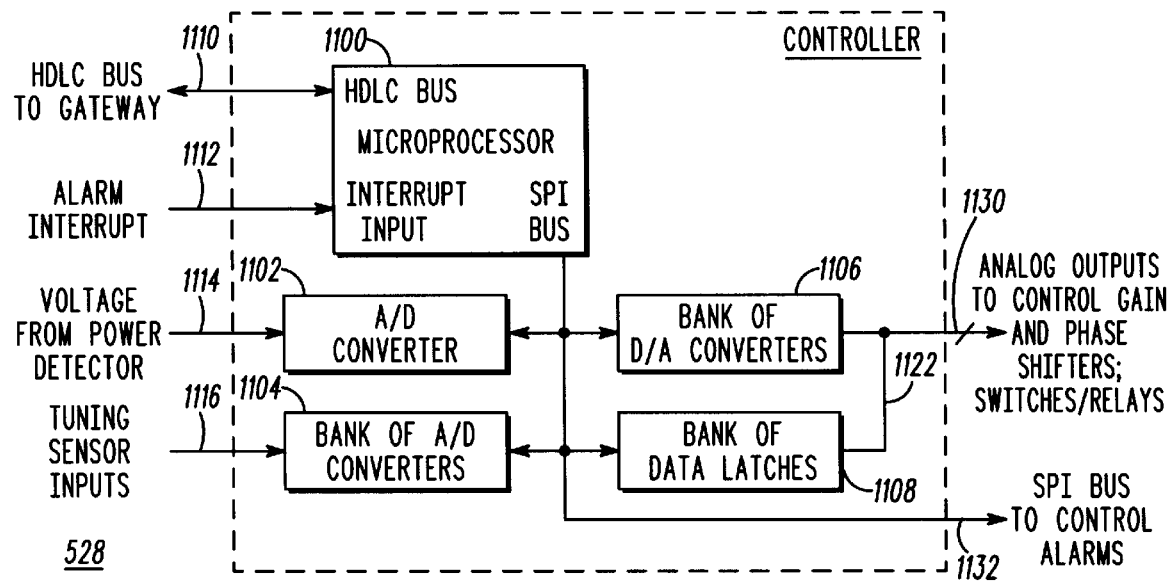

Referring to FIG. 11, a preferred embodiment of the controller module 528 and the gateway controller 506 is shown. The controller 528 includes a microprocessor 1100, an analog to digital converter (A/D) 1102, a bank of A/D converters 1104, a bank of D/A converters 1106, and a bank of data latches 1108. The microprocessor 1100 receives an alarm interrupt input 1112, and communicates with the gateway controller 506 via a data bus, such as the HDLC bus 1110 and communicates with the alarm detector 532 via control bus 1132. A/D converter 1102 receives a voltage level from power detector input 1114 and the bank of A/D converters 1104 receives a tuning sensor input 1116. The microprocessor 1100 communicates with the A/D converter 1102, the bank of A/D converters 1104, the bank of D/A converters 1106, and the bank of data latches 1108 over the internal bus 1118. The bank of data latches produces an output 1122 which is combined with the output of the bank of D/A converters 1106 to produce analog output lines 1130. The analog output lines control the gain of the variable attenuator 524, the input switch 520, and the output switch 530 for each of the modules 508. An example of a suitable A/D converter 1104 is an Analog Devices AD7891 eight channel 12 bit A/D converter. A suitable D/A converter 1106 is an Analog Devices AD7804 four channel 10 bit DAC or an Analog Devices AD8403 four channel 8 bit RDAC for the D/A where an alarm threshold setting is needed. An example of a suitable bank of data latches 1108 is a Motorola 74HCT273A. The controller 528 also includes the conventional supporting circuits described below with reference to the gateway controller 506.

The controller 528 performs many functions. For example, the controller 528 tracks its operation state and communicates with the gateway controller 506 to inform the gateway 506 of state transitions. The controller 506 also may be used to tune the power amplifiers 526, to monitor alarm sensors, and to control alarm thresholds. The controller 528, typically in response to the gateway controller 506, may open or close the input switch 520 or the output switch 530 and may adjust the gain of the variable attenuator 524.

The gateway controller 506 includes a microprocessor 1150 and communicates with the controller 528 via HDLC bus 1110. The gateway controller 506 also communicates with a system controller via a data link 1152, such as an Ethernet connection. The system controller may be a mobile switching center in a cellular system. The gateway controller 506 coordinates operation of the other controllers 528 in each of the amplifier modules 508 by tracking operating states, calculating amplifier gain values and offsets, and determining what actions each controller 528 should take. Most of the actions for the sleep mode and module shed methods take place in the gateway controller 506. Although not shown, those skilled in the art will understand that the gateway controller 506 includes conventional supporting circuitry, such as memory, a clock, a reset switch, various input/output port interfaces, such as the HDLC bus and the Ethernet interface, and other digital support logic to buffer and otherwise handle the various signals and components of the system.

Referring again to FIG. 5, during operation, an RF input signal 544 is split by splitter 502 into a plurality of signals 518 which are input to each of the plurality of power amplifier modules 508, 510, 512, 514. The split signals 518 are each amplified by the respective power amplifier module 508–514 and output as amplified signals 540. The amplified signals 540 are then combined by combiner 504 into an RF output signal 546. By using a splitter and combiner as described in FIG. 1–4, the number of active power amplifiers may be modified with an acceptable level of change in the overall power gain of the system 500. An alternative would be to use conventional isolating splitters and combiners, if the increased gain variation due to module changes is acceptable for the specific application.

Figure 6:
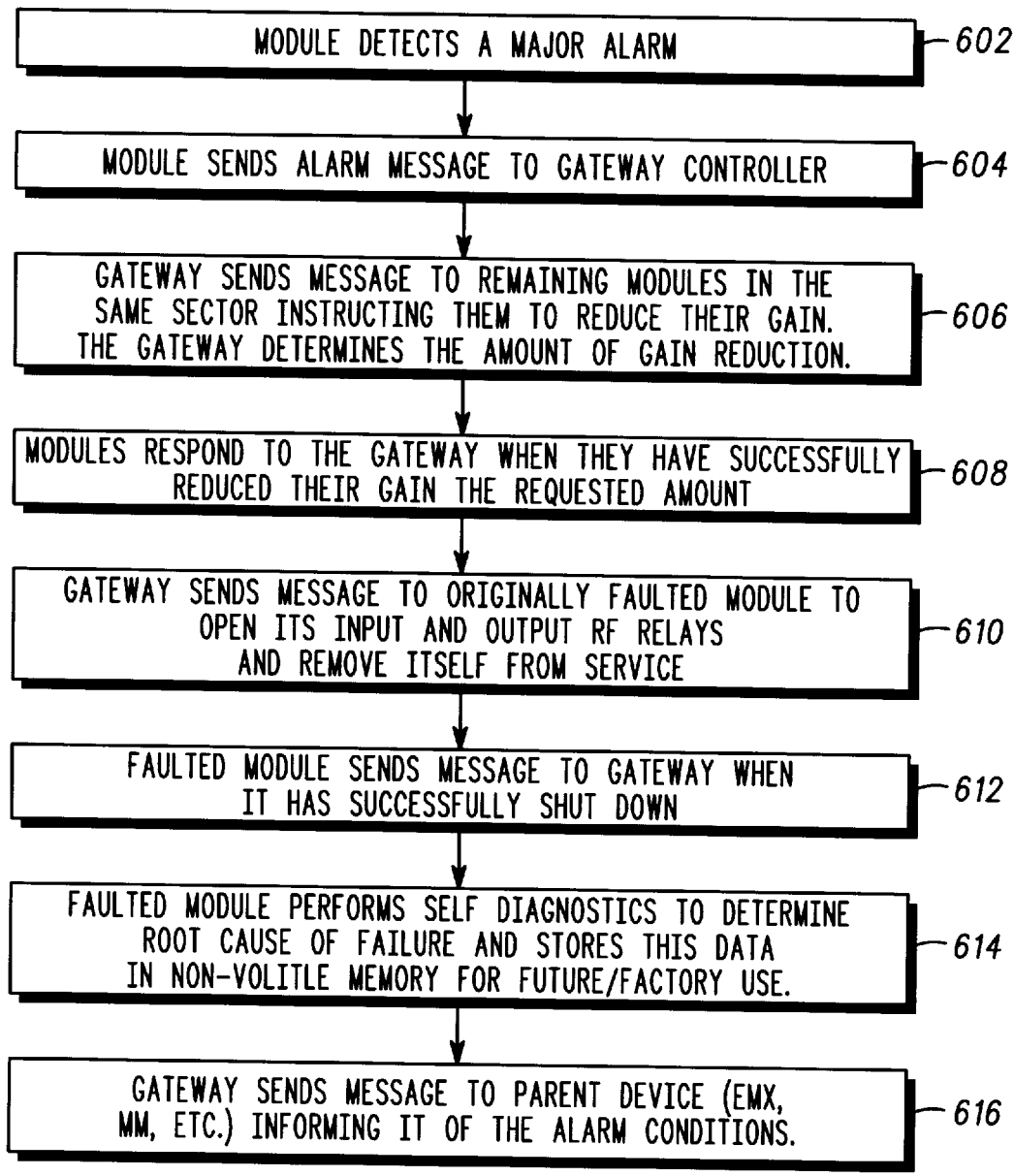
FIG. 6 is a flow chart of a method of controlling the power delivery system of FIG. 5 according to an embodiment of the present invention.

Referring now to FIG. 6, a method of controlling the power delivery system 500 is described. At step 602, one of the power amplifier modules 508–514 detects an alarm condition, such as via alarm detector 532 in module 508, that affects the service of that module. The control module 528 may detect an alarm condition either by routinely polling the alarm detectors 532, or by an interrupt input from the alarm detectors 532.

The affected module sends an alarm message to the gateway controller 506, at step 604. The gateway controller 606 sends a message to the other modules instructing them to reduce their power gain by a level determined by the controller 606. The following formula may be used to determine the amount of gain reduction:

10 * LOG (original number of modules in service/number of modules remaining in service after faulty module(s) removed)

Although the above formula gives the ideal power gain, due to inherent imperfections in circuit elements, it may be desirable to offset the ideal calculated value. For example, where there are four modules and one is to be removed, the ideal level of gain reduction is 1.25 dB, but an offset, such as an offset of 0.25 dB may be applied so that the total gain reduction of each of the other modules is at least about 1.25 dB and preferably about 1.5 dB.

The non-affected modules respond to the gateway 506 after they have successfully reduced their gain, at step 608. The modules 508–514 may reduce their gain by changing the attenuation level at the variable attenuator 524. The gateway controller 506 sends a message to the faulty module to open its input and output switches 520, 530, to remove that module from service. The faulty module then informs the gateway controller 506 that it has shut down, at step 612, performs diagnostic testing to determine the cause of the fault, and stores the results of the diagnostic testing in a non-volatile memory for future use, such as by factory personnel, at step 614. Finally, at step 616, the gateway controller 506 sends a message to a system controller, such as a mobile switching center or a mobility manager in a cellular system, of the alarm condition.

The above alarm control strategy permits implementation of a power amplifier system that performs at a high power gain level under at least three different conditions. In the first condition, an alarm is not active and the system maximum traffic load is less than the maximum capability of the system. This is normal operation, and a sleep mode method, described in further detail below, can be used to improve efficiency. Under the second condition, an alarm exists but the system maximum traffic load is less than the maximum capability of the system with the alarmed module removed from service. When the fault is detected, the alarmed module is removed from service. The above alarm control strategy allows the power delivery system to remain in service with negligible effect to the power gain of the power delivery system. In addition, the sleep mode method can still be used to improve efficiency even when the alarmed module is remove from service. In the third condition, an alarm is active and the system maximum traffic load is greater than the maximum capability of the system with the alarmed module removed from service. When the fault is detected, the alarmed module is removed from service and the gain of the power amplifier system 500 is reduced to prevent the remaining inservice amplifier modules from being over-driven. Under this third condition, sleep mode operation is usually suspended.

Figure 7:
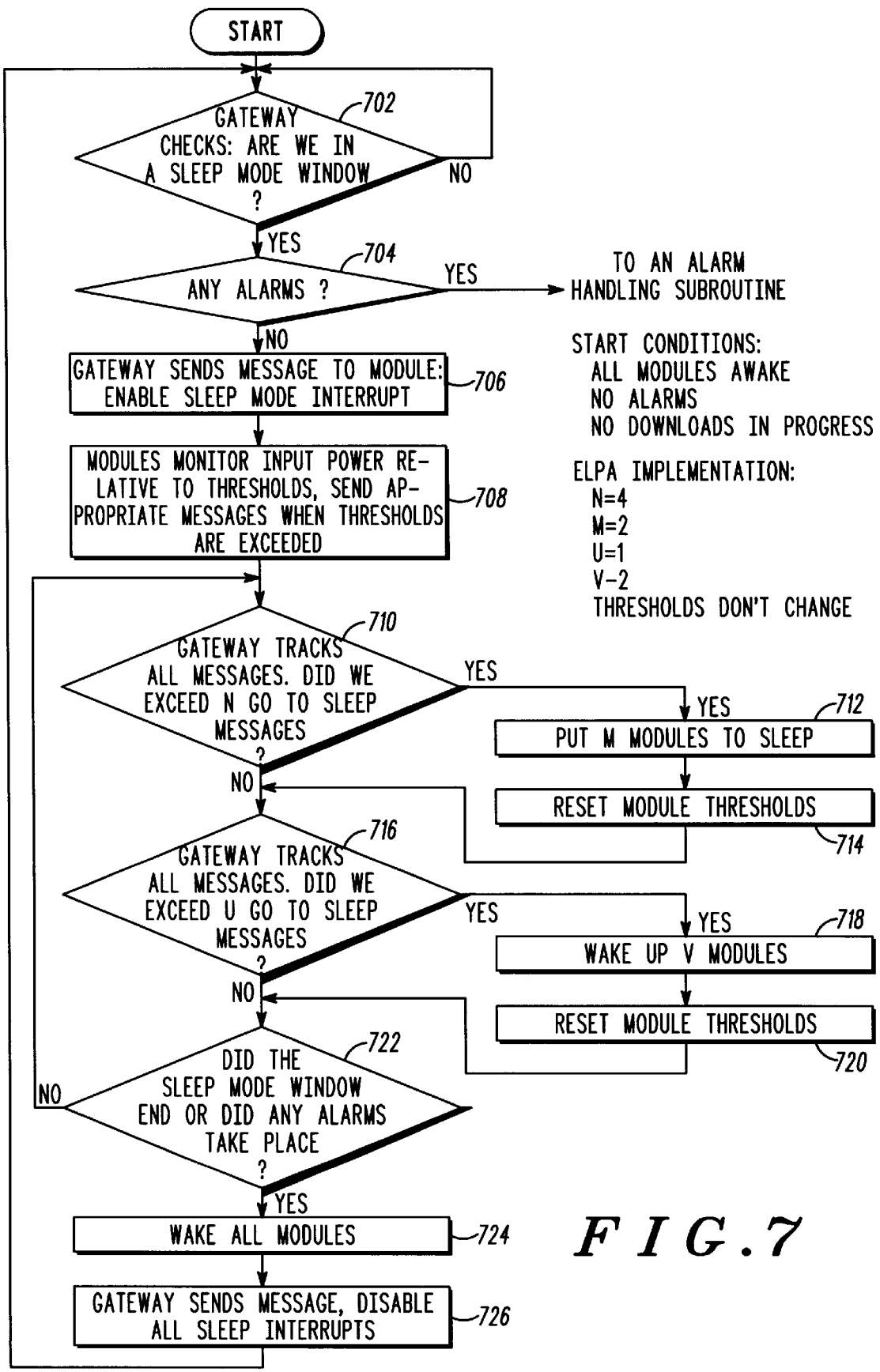
FIG. 7 is a flow chart of a method of controlling the power delivery system FIG. 5 according to another embodiment of the present invention.

Referring to FIG. 7, another embodiment of a method of controlling a power delivery system, such as the power delivery system 500 of FIG. 5, is illustrated. The method includes the steps of determining whether to place a given module into a sleep mode. In sleep mode, one or more power amplifiers are taken out of service temporarily to allow the power amplifier system 500 to operate more efficiently with lower operating costs. The sleep mode may be used in off times when traffic requirements are low. In sleep mode, the module is removed from service by opening the input switch 520 and the output switch 530. In addition, to further improve efficiency, at least some of the DC power dissipating circuits in the amplifier 526 are shut off. The control module 528 typically remains active so that tuning parameters of the amplifier 526 are quickly available after the module is awakened.

Beginning at step 702, and assuming a starting condition that all modules are awake, there are no alarms, and there is no downloading in progress, the gateway checks to determine if any of the modules are in a sleep time interval. One method of providing a sleep time interval is to store general traffic loading conditions based on time of day into the gateway. In this case, a sleep interval would occur at times during the day when traffic is lightest, such as during the early morning hours (e.g. 1–4 A.M.). If the sleep window condition passes, the status of alarms is checked, at step 704. If there are alarms, then processing proceeds as described in FIG. 6. Otherwise, the gateway sends a message to the modules to enable a sleep mode interrupt to allow for sleep mode. At step 708, each of the modules monitor traffic levels, such by monitoring input power readings from the power detector, compare the readings to a threshold, and send messages back to the gateway when thresholds are exceeded. The gateway determines the number of modules to put to sleep and the number to wake up based on sleep messages and wakeup messages from the modules. In the particular example of FIG. 7, steps 710–720, the gateway puts two of the four modules to sleep and then wakes up both modules if any wakeup message is received. However, it is contemplated that many other combinations of modules put to sleep or woken up based on the thresholds and messages received by the gateway are possible depending on the particular application. Continuing at step 722, if the sleep window has ended or any alarm conditions are detected, all modules are woken up, at step 724, and the gateway sends a message to all modules to disable sleep interrupts. Otherwise, processing for steps 710–720 is repeated.

Figure 12A:
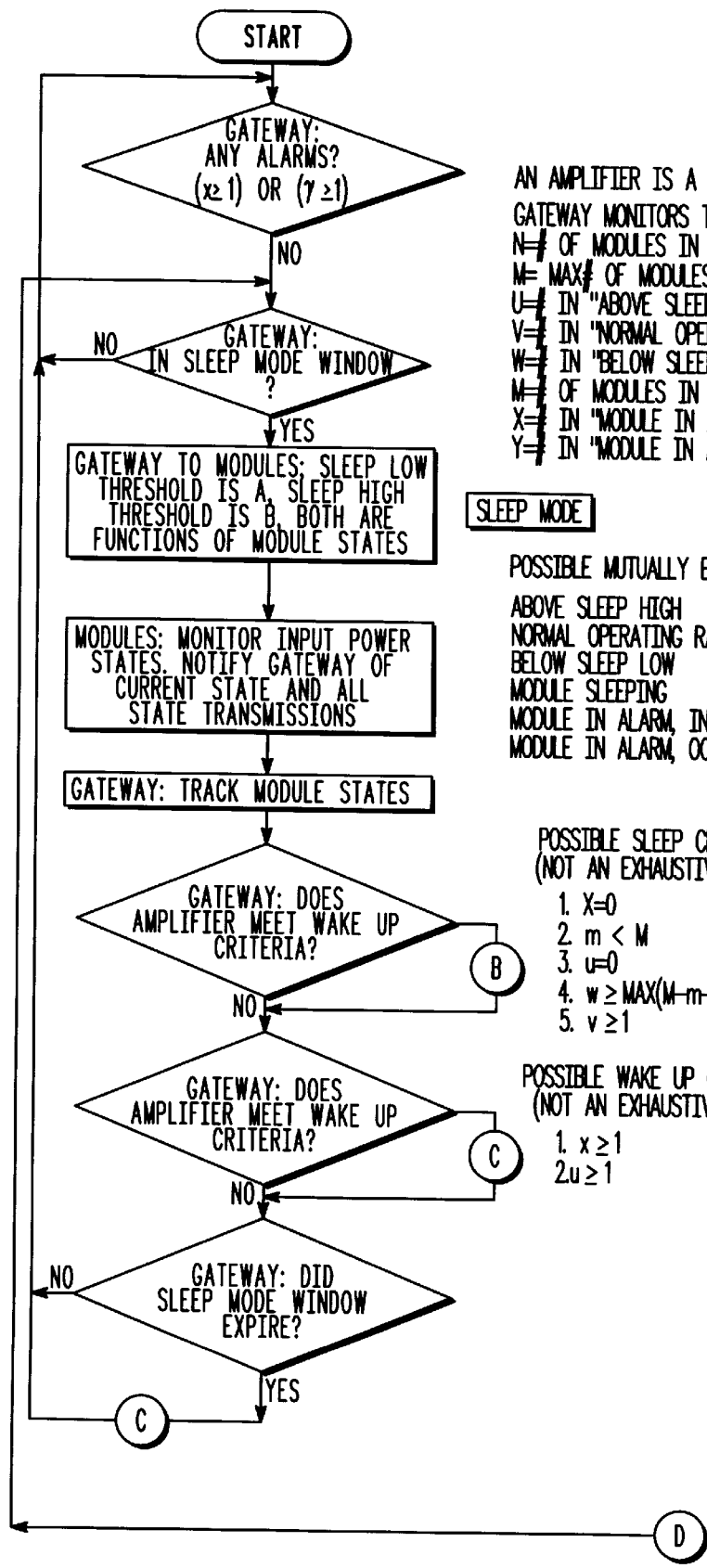
FIGS. 12A and 12B and 12C are flow charts of a method of controlling the power delivery system of FIG. 5.
Figure 12B:
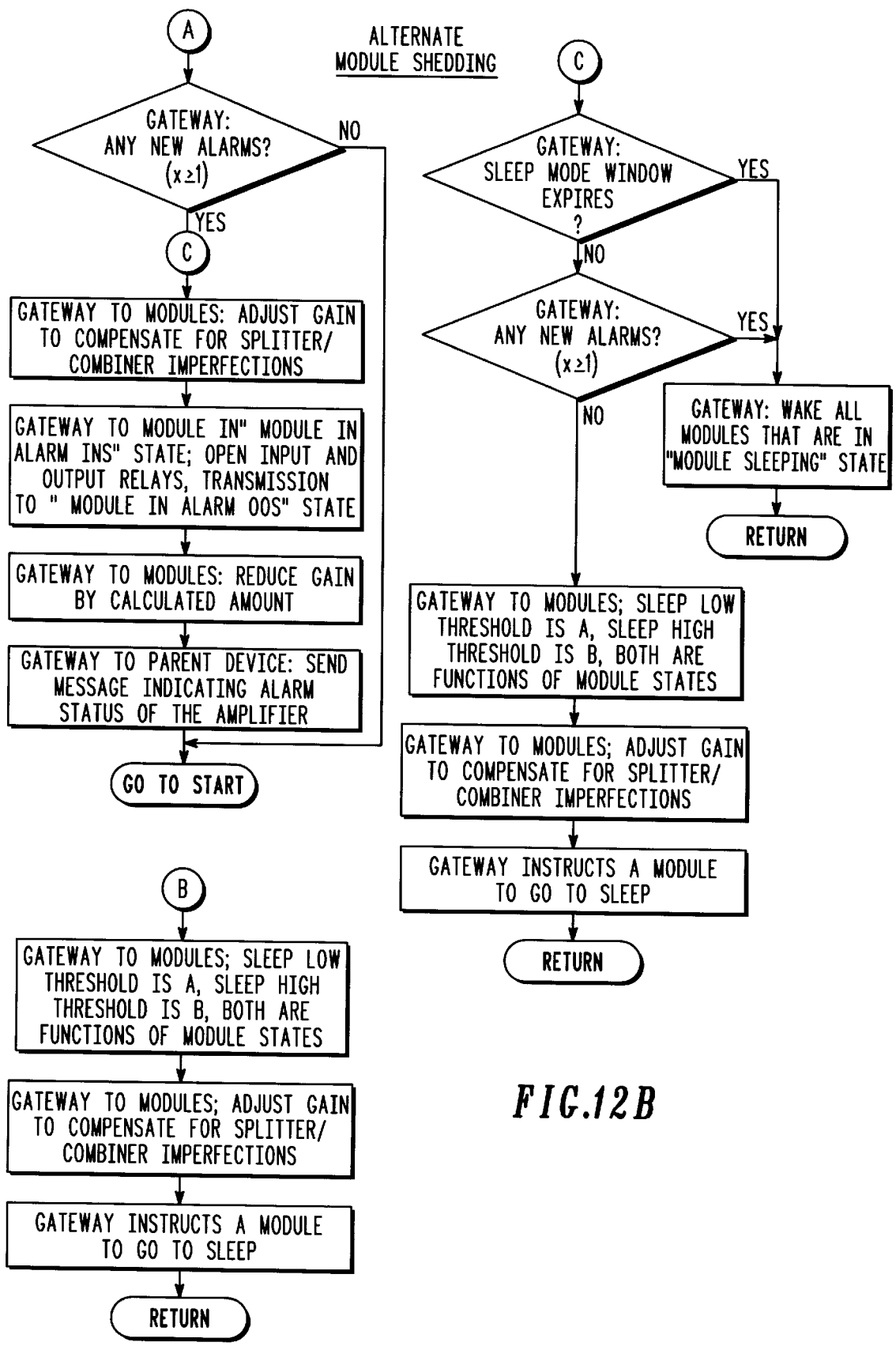

Although the method of controlling the power delivery system 500 has been described separately with respect to a specific module shedding method in FIG. 6 and a specific sleep mode method in FIG. 7, it is possible, and in some applications preferable, to use a combination of both of the methods. In addition, although certain criteria, such as power level or alarm conditions may be used to determine when to enter and leave the sleep mode, many other sleep criteria may be used. For example, the number of modules in sleep mode, whether the module is below a sleep low threshold or above a sleep high threshold, and whether a particular module is in service or out of service. A detailed flow chart of an example of a method of controlling a power delivery system using a combination of both module shedding and sleep mode as well as a variety of sleep mode criteria is shown in FIG. 12A and FIG. 12B.

Figure 13:
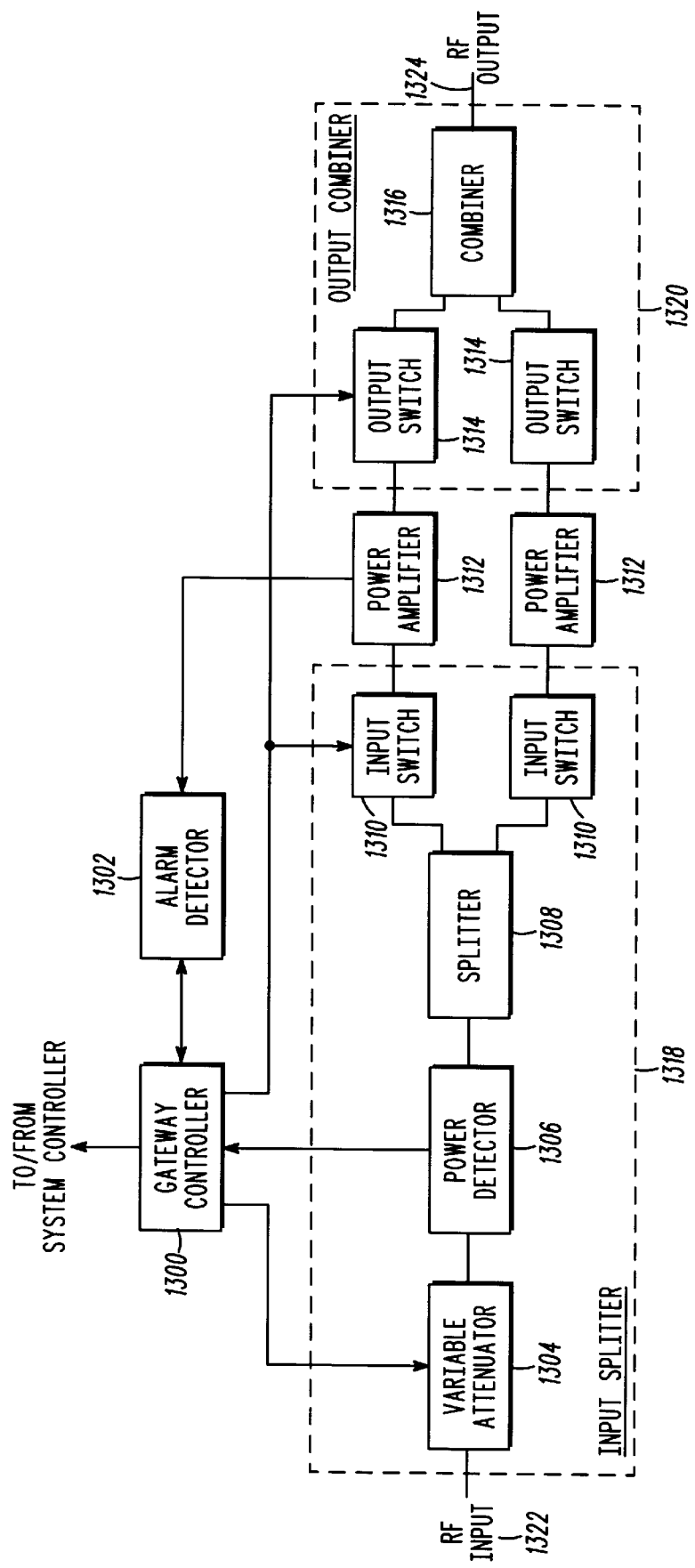
FIG. 13 is a block diagram of another embodiment of a power delivery system.

Referring to FIG. 13, another embodiment of a power delivery system is illustrated. The power delivery system includes an input splitter 1318, a gateway controller 1300, an alarm detector 1302, power amplifiers 1312, and an output combiner 1320. The input splitter 1318 includes a variable attenuator 1304, a power detector 1306, a power splitter 1308, and a first and a second input switch 1310. The variable attenuator 1304 receives an RF input signal 1322. The power detector 1306 is in communication with the gateway controller 1300, and the input switches 1310 are each coupled to a respective power amplifier 1312. The output combiner 1320 includes first and second output switches 1314 and a power combiner 1316. The output switches 1314 are each coupled to a respective power amplifier 1312. The combiner 1316 outputs an RF output signal 1324. The alarm detector 1302 is coupled to the power amplifiers 1312 and the gateway controller 1300. In this embodiment, a single variable attenuator, such as variable attenuator 1304, may be used to adjust the gain of more than one power amplifier 1312. In addition, the input switches 1310 are located at the input splitter 1318, instead of in power amplifier modules. By placing the input switches 1310 and the variable attenuator 1304 in the input splitter 1318 instead of in the various power amplifier modules, a local module controller, such as controller 528 of FIG. 5, is not needed. Instead, all of the control functions are performed in the common gateway controller 1300.

Figure 12C:
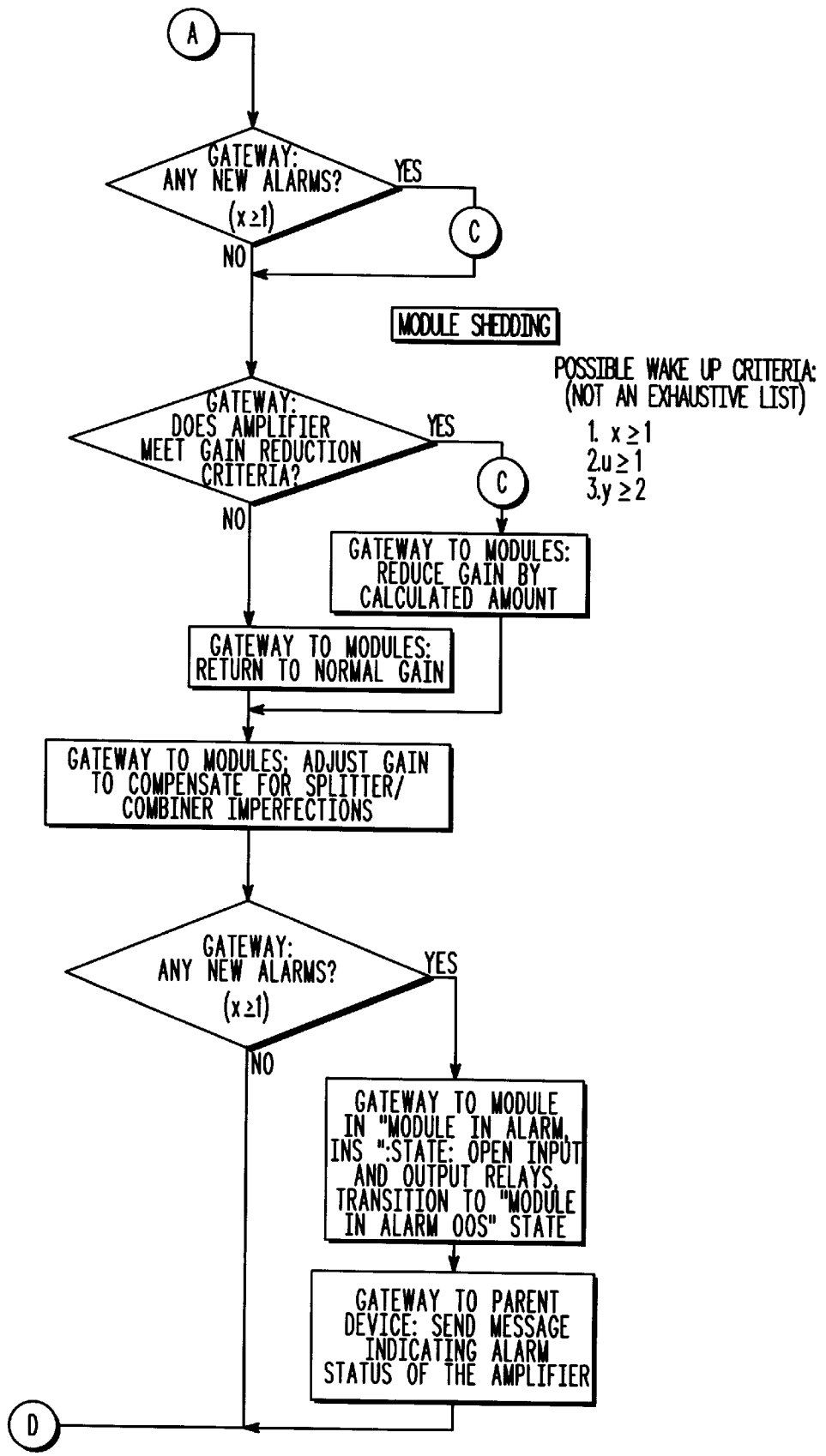

Although different reference numbers have been used between FIG. 5 and FIG. 13, each of the individual components disclosed in FIG. 13 is preferably the same as those described in further detail above in reference to FIG. 5. For example, the power detector 1306 of FIG. 13 is preferably the same as the power detector 522 of FIG. 5 and FIG. 8. Also, the method of controlling a power delivery system as described with reference to FIGS. 6, 7, and 12 may be used with the system of FIG. 13 as well as with the system of FIG. 5.

The above described embodiments have many benefits. For example, by adjusting the gain of other modules after an alarm is detected in a first module, the same number of traffic channels may be maintained (although at reduced power). By using the sleep mode approach, modules may be inactivated during times when full power is not needed, such as during low traffic times during the day. In this manner, the useful life of each module can be extended, improving efficiency and reducing costs of operation. Another potential benefit is that the system has great flexibility since modules may be physically added to the system, or an extra module could be added for high traffic periods or for redundancy purposes. In this case, the extra module would normally be in the sleep mode, i.e. inactive, but could be quickly activated if another module failed or if the traffic level exceeded the capacity of the other modules.

In addition, further advantages and modifications will readily occur to those skilled in the art. The invention, in its broader aspects, is therefore not limited to the specific details, representative apparatus, and illustrative examples shown and described herein. Various modifications and variations can be made to the above specification without varying from the scope or spirit of the invention, and it is intended that the present invention cover all such modifications and variations provided they come within the scope of the following claims and their equivalents.

What is claimed is:

1. A power delivery system for use in a radio frequency system comprising:

a power splitter;

a plurality of power amplifier modules responsive to the power splitter, each of the plurality of power amplifier modules comprising:

an input switch;

a variable attenuator;

an RF power amplifier responsive to the variable attenuator and the input switch;

an output switch responsive to the RF power amplifier; and an alarm detector for indicating an alarm condition of the RF power amplifier;

a power combiner responsive to each of the plurality of power amplifier modules; and a gateway controller in communication with each of the plurality of power amplifier modules.

2. The power delivery system of claim 1, wherein the gateway controller is in communication with the alarm detector and the variable attenuator of each of the plurality of power amplifier modules.

3. The power delivery system of claim 2, wherein the gateway controller receives an indication that a first of the plurality of power amplifier modules is in an alarm condition and the gateway controller instructs each of the variable attenuators in each of the other power amplifier modules to change the gain of the respective RF power amplifiers.

4. The power delivery system of claim 3, wherein the gateway controller determines a gain adjustment level and instructs each of the variable attenuators in each of the other power amplifier modules to change the gain of the respective RF power amplifiers to the determined gain adjustment level.

5. The power delivery system of claim 2, wherein the gateway controller switches open the input and the output switch of the first of the plurality of power amplifier modules to take the first power amplifier module out of service.

6. The power delivery system of claim 5, wherein the first power amplifier sends a message to the gateway controller when the first power amplifier has been successfully taken out of service.

7. The power delivery system of claim 5, wherein the first power amplifier performs a diagnostic test and stores the result in a memory.

8. The power delivery system of claim 3, wherein the gateway controller sends an alarm message to a system controller after receiving the indication that the first power amplifier module is in an alarm condition.

9. The power delivery system of claim 8, wherein the second controller comprises a mobile switching center of a cellular system.

10. The power delivery system of claim 1, wherein each of the power amplifier modules further comprise a local control module in communication with the RF amplifier and the gateway controller.

11. A method of controlling a plurality of power amplifier modules in a power delivery system comprising the steps of:

detecting an alarm condition in a first of the plurality of power amplifier modules;

determining a gain reduction level;

reducing the power gain in each of the other power amplifier modules by the determined gain reduction level; and taking the first power amplifier module out of service.

12. The method of claim 11, further comprising the steps of:

performing diagnostic testing on the first power amplifier module after detecting the alarm condition; and storing results from the diagnostic testing in a memory.

13. The method of claim 11, wherein the gain reduction level is determined based on a number of non-alarm power amplifier modules of the plurality of power amplifier modules and the total number of the plurality of power amplifier modules.

14. The method of claim 11, wherein substantially the same gain reduction level is applied to each of the other power amplifier modules.

15. In a power delivery system with a power splitter, a plurality of power amplifier modules, and a power combiner, a method of controlling the plurality of power amplifier modules comprising the steps of:

determining whether a sleep criteria has been met;

when the sleep criteria has been met placing one of the plurality of power amplifier modules in a sleep mode during a sleep time interval; and placing the one of the plurality of power amplifier modules in an active mode.

16. The method of claim 15, wherein the one of the plurality of power amplifier modules is placed in an active mode after an alarm condition in another of the plurality of modules is detected.

17. The method of claim 15, further comprising comparing a detected call load with a predetermined threshold.

18. The method of claim 17, wherein the one of the plurality of power amplifier modules is placed in an active mode in response to the comparison.

* * * * *